(12) United States Patent
Raberg et al.

(10) Patent No.: US 8,492,810 B2
(45) Date of Patent: Jul. 23, 2013

(54) METHOD OF FABRICATING AN INTEGRATED ELECTRONIC CIRCUIT WITH PROGRAMMABLE RESISTANCE CELLS

(75) Inventors: Wolfgang Raberg, Fontainebleau (FR); Klaus-Dieter Ufert, Unterschleissheim (DE)

(73) Assignee: Qimonda AG, Munich (DE)

( * ) Notice: Subject to any disclaimer, the term of this patent is extended or adjusted under 35 U.S.C. 154(b) by 781 days.

(21) Appl. No.: 11/363,494

(22) Filed: Feb. 28, 2006

(65) Prior Publication Data
US 2007/0200155 A1   Aug. 30, 2007

(51) Int. Cl.
 *H01L 29/94* (2006.01)
 *B05D 5/12* (2006.01)
 *G11C 11/00* (2006.01)

(52) U.S. Cl.
 USPC .......................................... 257/296; 438/102

(58) Field of Classification Search
 CPC ............. H01L 29/94; B05D 5/12; G11C 11/00
 See application file for complete search history.

(56) References Cited

U.S. PATENT DOCUMENTS

| | | |
|---|---|---|
| 6,418,049 B1 | 7/2002 | Kozicki |
| 2003/0049912 A1 | 3/2003 | Campbell et al. |
| 2003/0068862 A1 | 4/2003 | Li et al. |
| 2003/0209728 A1 | 11/2003 | Kozicki |
| 2003/0209971 A1 | 11/2003 | Kozicki |
| 2004/0076051 A1 | 4/2004 | Klein |
| 2004/0175621 A1* | 9/2004 | Iriyama et al. ........... 429/231.95 |
| 2005/0243633 A1* | 11/2005 | Symanczyk .................. 365/226 |
| 2005/0286211 A1 | 12/2005 | Pinnow et al. |
| 2006/0043354 A1 | 3/2006 | Pinnow et al. |

FOREIGN PATENT DOCUMENTS

| | | |
|---|---|---|
| DE | 10-2004-041905 A1 | 3/2006 |
| WO | WO-97/48032 | 12/1997 |
| WO | WO-03/032392 A2 | 4/2003 |

OTHER PUBLICATIONS

M. Mitkova and M.N. Kozicki, "Silver incorporation in Ge-Se glasses used in programmable metallization cell devices," as published in Journal of Non-Crystaline Solids 299-302 (2002).*

Kozicki, M.N.; Gopalan, C.; Balakrishnan, M.; Park, M.; Mitkova, M.;, "Nonvolatile memory based on solid electrolytes," Non-Volatile Memory Technology Symposium, 2004 , vol., no., pp. 10-17, Nov. 15-17, 2004.*

* cited by examiner

*Primary Examiner* — Walter H Swanson
(74) *Attorney, Agent, or Firm* — Patterson & Sheridan LLP

(57) ABSTRACT

Method of fabricating an integrated electronic circuit with programmable resistance cells, which comprises providing a substrate; forming an inert electrode; forming a solid electrolyte on the inert electrode; forming an interlayer on the solid electrolyte, the interlayer comprising an active electrode material and nitrogen; and forming an active electrode on the interlayer, the active electrode comprising the active electrode material.

20 Claims, 3 Drawing Sheets

METHOD OF FABRICATING AN INTEGRATED ELECTRONIC CIRCUIT WITH PROGRAMMABLE RESISTANCE CELLS

TECHNICAL FIELD OF THE INVENTION

The invention relates to a method of fabricating an integrated electronic circuit with programmable resistance cells, and to programmable resistance cells and to an integrated electronic data memory with programmable resistance cells.

BACKGROUND OF THE INVENTION

Demands imposed on large scale integrated electronic circuits are constantly increasing. Particularly, in the case of electronic data memories, programmable logic modules, and microprocessors, it is important to continue the progress of integration. To ensure the economic success of such devices it is often essential to maximize the number of functional electronic elements on a given substrate die. In the case of electronic data memories, ongoing development is aimed mainly at information density, access speed, and the so-called volatility, the latter being a figure of how long the electronic data memory may reliably hold a stored information content without the need of an external supply of energy.

Whereas volatile memories, such as a DRAM (Dynamic Random Access Memory), store information only for a short time, and, therefore, have to be continuously refreshed, the semiconductor industry has also developed a range of non-volatile memories, such as the Flash RAM. Although a Flash RAM reliably retains the information stored in it for several years without an external energy supply, a large amount of energy is required to write information into a Flash RAM and the integration of a Flash RAM is rather limited due to the respective memory cell's large size.

As a result, substantial scientific and industrial research effort is made to develop new concepts for non-volatile memories. A prominent example of a non-volatile memory is an electronic data memory with programmable resistance cells. These programmable resistance cells change their electric resistance by means of the application of electric signals, while the electric resistance remains stable in the absence of any signals. In this way, such a memory cell may store two or more logic states by a suitable programming of its electric resistance. A binary coded memory cell may then, for example, store an information state "0" via assuming a high-resistive state, and an opposite information state "1" via assuming a low-resistive state.

A material system for such programmable resistance cells are the so-called solid electrolytes, which are already subject to intense research and development. This material system is therefore already well understood as a feasible system for the realization of programmable resistance cells. In materials of this type, a conductive path may be formed from an active electrode material by means of the application of electric signals. Ions from the active electrode material are mobile within the ion-conducting solid electrolyte and can therefore be driven by an electric field into and within the electrolyte. If a path of ions is formed, this path may short-circuit the otherwise high-resistive solid electrolyte between two electrodes, hence drastically reducing the effective electric resistance. Said electrodes may also serve for the application of the electric signals. By reversing the polarity of the electric signal, it is possible to decompose the path of ions such to lead back the programmable resistance cell to a high-resistive state. A so-called inert electrode, which consists of a material that does not dissolve in the electrolyte, often serves as a counter-electrode to the active electrode made from active electrode material.

In this context, the integration of solid electrolyte materials into existing and established fabrication processes for the large scale integrated manufacturing of electronic circuits is of great interest. The most prominent of such manufacturing processes is the so-called CMOS process, which is employed to routinely manufacture highly integrated electronic circuits. Such a CMOS process often comprises several hundred individual process steps and forms an integrated circuit device by means of lithography, deposition, and etching techniques.

Since the required materials for solid electrolyte systems, such as germanium, selenium, silver, or copper, are not part of present established CMOS manufacturing processes, there is a need to introduce methods for a reliable and reproducible handling of the abovementioned materials by a CMOS process. Unfortunately, certain material incompatibilities impose critical obstacles for such a handling, for example when using germanium selenide and silver: silver, as an active electrode material, only grows in thin films in an inhomogeneous form on a solid electrolyte. However, an inhomogeneous electrode layer, in some cases even comprising coagulated islands, may lead to difficulties and problems during further processing and structuring of other device elements and layers. Conventional methods employ an increased layer thickness of the active electrode in order to avoid a disadvantageous inhomogeneous form thereof. This however, in turn, counteracts the objective of an increased integration and a higher packing density of the programmable resistance cells.

SUMMARY OF THE INVENTION

The present invention provides advantages for an improved programmable resistance cell, an improved integrated electronic data memory with programmable resistance cells, and an improved method of fabricating an integrated circuit with programmable resistance cells.

In one embodiment of the present invention, there is a method of fabricating an integrated electronic circuit with programmable resistance cells comprising: providing a substrate, forming an inert electrode, forming a solid electrolyte on the inert electrode, forming an interlayer on the solid electrolyte, wherein the interlayer comprises an active electrode material and nitrogen, and forming an active electrode on the interlayer, wherein the active electrode comprises the active electrode material.

In another embodiment of the present invention, there is a method of fabricating an integrated electronic circuit with programmable resistance cells comprising: providing a substrate, forming an inert electrode, forming a solid electrolyte on the inert electrode, forming a further interlayer on the solid electrolyte, wherein the further interlayer comprises an active electrode material, solid electrolyte material, and nitrogen, forming an interlayer on the further interlayer, wherein the interlayer comprises the active electrode material and nitrogen, and forming an active electrode on the interlayer, wherein the active electrode comprises the active electrode material.

In still another embodiment of the present invention, there is a programmable resistance cell formed on a substrate and comprises an inert electrode, a solid electrolyte on the inert electrode, an interlayer on the solid electrolyte, wherein the interlayer comprises active electrode material and nitrogen, and an active electrode on the interlayer which comprises the active electrode material.

In yet another embodiment of the present invention, there is a programmable resistance cell is formed on a substrate and comprises an inert electrode, a solid electrolyte on the inert electrode, a further interlayer on the solid electrolyte, wherein the further interlayer comprises an active electrode material, solid electrolyte material, and nitrogen, an interlayer on the further interlayer, wherein the interlayer comprises the active electrode material and nitrogen, and an active electrode on the interlayer which comprises the active electrode material.

In another embodiment of the present invention, there is an integrated electronic data memory comprises programmable resistance cells with an inert electrode, a solid electrolyte on the inert electrode, an interlayer on the solid electrolyte, wherein the interlayer comprises an active electrode material and nitrogen, and an active electrode on the interlayer which comprises the active electrode material.

BRIEF DESCRIPTION OF THE DRAWINGS

These above recited features of the present invention will become clear from the following description, taken in conjunction with the accompanying drawings. It is to be noted, however, that the accompanying drawings illustrate only typical embodiments of the present invention and are, therefore, not to be considered limiting of the scope of the invention. The present invention may admit other equally effective embodiments.

DETAILED DESCRIPTION OF THE INVENTION

Figure 1A:
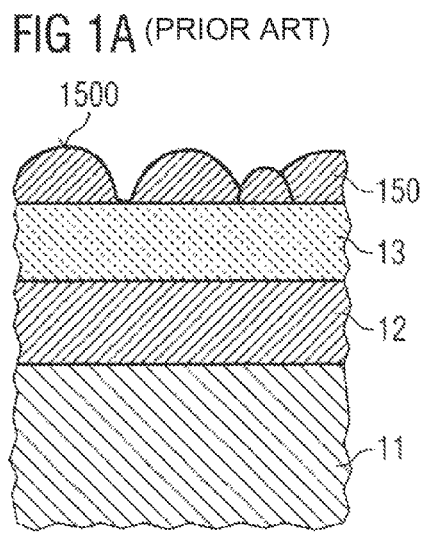
FIG. 1A shows a schematic view of a conventional layer setup.

FIG. 1A shows a schematic view of a conventional layer setup: an inert electrode 12 is arranged on a substrate 11 and a solid electrolyte 13 is arranged on the inert electrode 12. If a thin film of active electrode material is now to be deposited on the solid electrolyte 13, usually an inhomogeneous active electrode 150 may be the result. As shown, it is even possible for disadvantageous coagulated islands to form. The surface 1500 of the active electrode 150 in this case has an uneven surface topology. This renders the reliable and reproducible deposition of further layers difficult, or even impossible. Furthermore, the electric properties of the active electrodes of a programmable resistance cell may be significantly disturbed, making it difficult to reliably apply electric signals to the solid electrolyte 13.

Figure 1B:
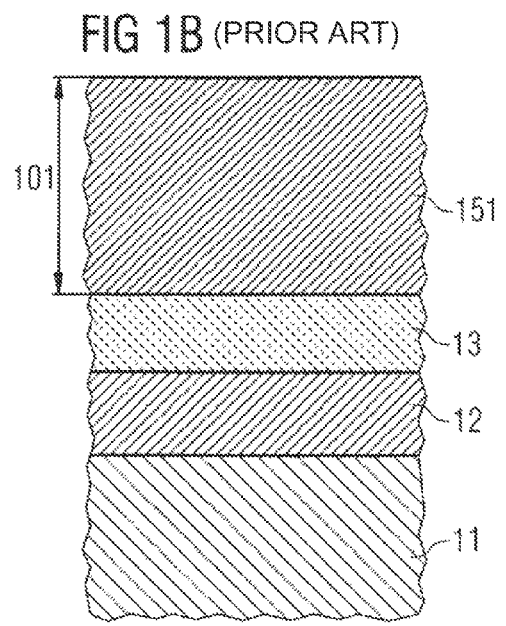
FIG. 1B shows a schematic view of an improved conventional layer setup.

FIG. 1B shows a schematic view of an improved conventional layer setup: the solid electrolyte 13 is again arranged on the inert electrode 12, which, in turn is arranged on the substrate 11. As shown, formation of islands or formation of the active electrode layer 151 in an inhomogeneous form is prevented by increasing the thickness of the active electrode layer 151 to a thickness 101. The active electrode 151 is deposited with this increased layer thickness 101 such to allow for its homogeneous deposition on the solid electrolyte 13. The increased layer thickness 101 of the active electrode 151, however, represents a significant obstacle to reducing the size of the programmable resistance structures in an integrated circuit.

Figure 1C:
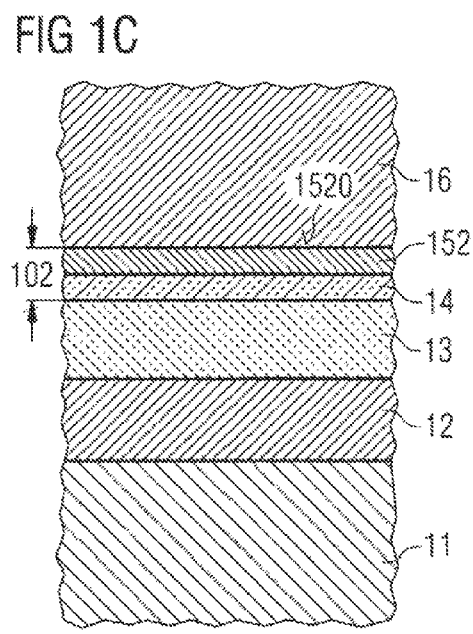
FIG. 1C shows a schematic view of a layer setup according to a first embodiment of the present invention.
Figure 1D:
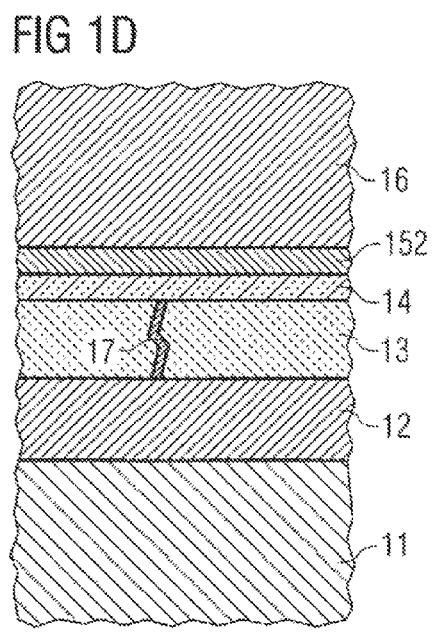
FIG. 1D shows a schematic view of a layer setup in conjunction with a conductive path according to the first embodiment of the present invention.

FIGS. 1C and 1D schematically show the layer setup according to a first embodiment of the present invention. The inert electrode 12 is arranged on the substrate 11, and the solid electrolyte 13 is arranged on the inert electrode 12. According to this embodiment of the present invention, an interlayer 14 is arranged on the solid electrolyte 13. The interlayer 14 prevents an inhomogeneous formation of active electrode material in the form of coagulated islands or other disadvantageous forms on solid electrolyte materials, such as germanium selenide. Hence, the active electrode is formed continuously and uniformly on the interlayer 14, providing a layer thickness which is substantially constant over the horizontal extent of the interlayer 14. The interlayer 14 preferably contains nitrogen, which enables the homogeneous formation of the active electrode from active electrode material, even in the form of thin films.

The reduced layer thickness 102 of the interlayer 14 in combination with the active electrode 152 is significantly less than the disadvantageous layer thickness 101. Therefore, there is no need for the provision of thick layers and the restrictions, as far as the integration and packing density of programmable resistance cells are concerned, are thereby lifted. In addition to this, the active electrode 152 provides an advantageous homogeneous planar surface 1520, which allows for a reliable and reproducible deposition of further elements and layers, such as—as shown here—a conductor 16.

The inventive method therefore allows for an advantageous further processing and an enhanced integration of an integrated electronic circuit with programmable resistance cells, since homogeneity of the active electrode may be achieved also for thin films. This renders possible a higher packing density of programmable resistance cells, and, for example, an integrated electronic data memory accordingly may provide a greater storage capacity per die size or, respectively, requires significantly less material and space to attain a given target storage capacity.

FIG. 1D demonstrates the operation of the solid electrolyte 13 as an element with a programmable resistance. By means of applying electric signals between the inert electrode 12 and the active electrode 152, it is possible for a conductive path 17 to form in the solid electrolyte 13. The conductive path 17 comprises active electrode material, which may be provided by the solid electrolyte 13, the interlayer 14, or the active electrode 152. This conductive path 17 short-circuits the otherwise high-resistive solid electrolyte 13 and reduces the effective electric resistance between the inert electrode 12 and the active electrode 152. By means of a corresponding reversal of the polarity of the electric signals, it is possible to decompose the conductive path 17, such to lead back the structure to a high-resistive state.

Figure 1E:
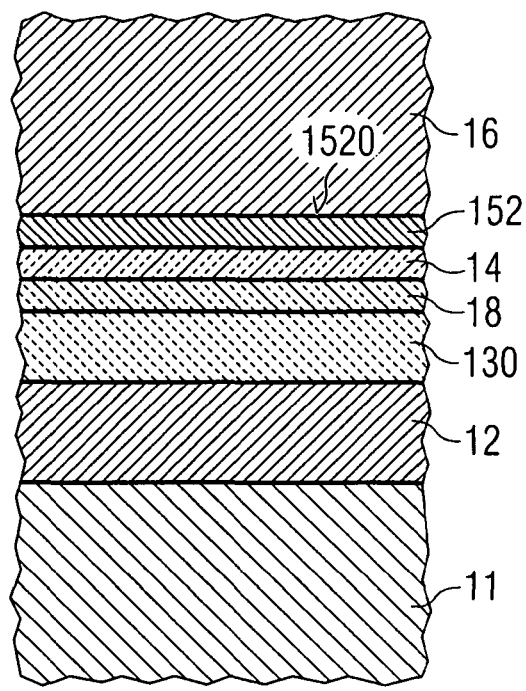
FIG. 1E shows a schematic view of a layer setup according to a second embodiment of the present invention.

FIG. 1E schematically shows a layer setup according to a second embodiment of the present invention. The inert electrode 12 is arranged on the substrate 11, and a solid electrolyte 130 is arranged on the inert electrode 12. According to this embodiment, a further interlayer 18 is arranged on the solid electrolyte 130, and the interlayer 14 is arranged on said further interlayer 18. The further interlayer 18 comprises both active electrode material and nitrogen, as well as solid electrolyte material. The layer setup, which includes the solid electrolyte 130, the further interlayer 18, and the interlayer 14, allows for a thin and homogeneous deposition of the active electrode 152 in a particularly advantageous way.

The further interlayer 18 serves as a transition layer between the solid electrolyte 130 and the interlayer 14, and advantageously improves the growth conditions and manufacturing of the overall layer setup. Preferably, the further interlayer 18 comprises nitrogen. The nitrogen concentration in the further interlayer 18 may be at least 15%. Additionally, the thickness of the further interlayer 18 ranges preferably from 1.5 nm to 5 nm, which is sufficient to ensure a homogeneous growth of the entire layer setup, and the further interlayer 18, at the same time, is thin enough to maintain the advantageous small size of the programmable resistance cell.

Figure 2:
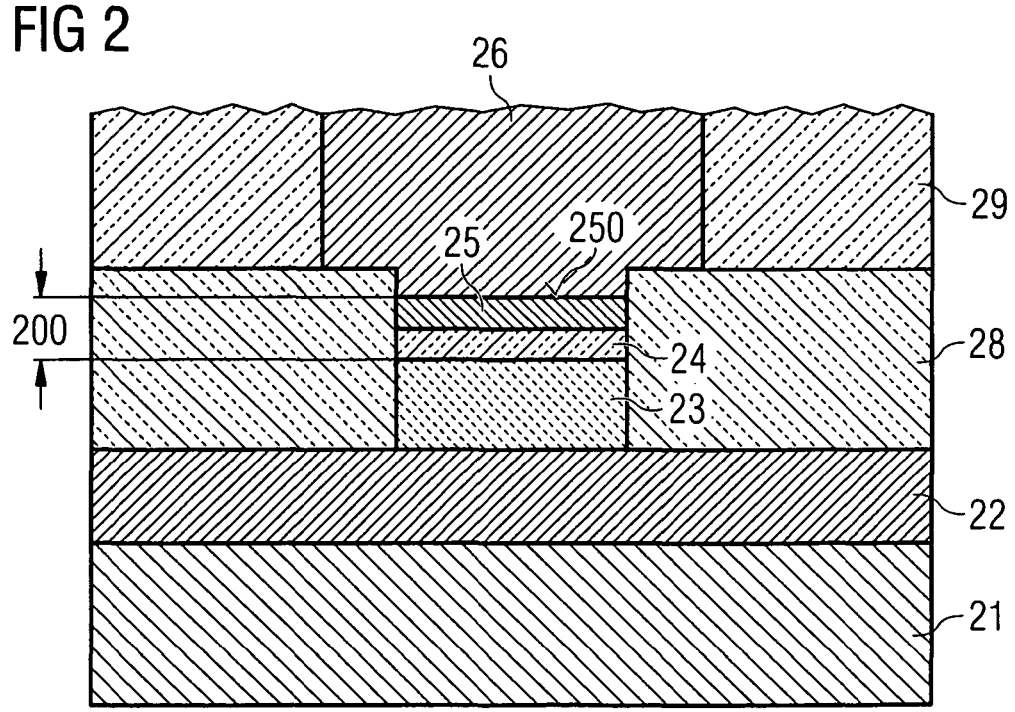
FIG. 2 shows a schematic view of a programmable resistance cell according to a third embodiment of the present invention.

FIG. 2 schematically shows a programmable resistance cell according to a third embodiment of the present invention. An inert electrode 22 is arranged on a substrate 21. A patterned insulation layer 28 is arranged on the inert electrode 22. The patterned insulation layer 28 defines individual cells with a programmable electric resistance. In a trench of the patterned insulation layer 28 there is a solid electrolyte 23, on which an interlayer 24 allows for the formation of a thin and homogeneous active electrode 25. The smooth surface 250 of the active electrode 25 advantageously allows for the deposition of further elements, such as a conductor 26, which is arranged in between a patterned further insulation layer 29. The inventive provision of the interlayer 24 allows for the layer setup of the interlayer 24 and the active electrode 25 to be formed with an optimized reduced layer thickness 200. In this way, the overall thickness of the layer setup may be minimized, and, as a result, the integration may be increased, while still being able to reliably fabricate and operate the device.

The substrates 11, 21 are generally formed from silicon, to which highly developed and established manufacturing processes, such as a CMOS process, may apply for the fabrication of an integrated electronic circuit. The substrates 11, 21 may already include electronic elements, such as transistors, conductive layers or insulation layers. The inert electrodes 12, 22 are preferably in electric contact to said electronic elements and/or conduction elements of the substrates 11, 21.

There are no particular demands imposed on the material of the inert electrodes 12, 22, although it is advantageous for the inert electrodes 12, 22 to be formed from a conducting material which does not dissolve in the solid electrolytes 13, 23, 130. Examples of these materials include doped or undoped poly-crystalline silicon or the metals which are commonly processed in the semiconductor industry, such as gold, tungsten, or aluminum.

The solid electrolytes 13, 23, 130 comprise, for example, germanium selenide or germanium sulfide. Other advantageous materials include germanium telluride, silicon selenide, silicon sulfide, lead sulfide, lead selenide, lead telluride, tin sulfide, tin selenide, tin telluride, zinc sulfide, zinc selenide, cadmium sulfide or cadmium selenide. If the solid electrolyte comprises germanium, a respective germanium content may preferably be in the range of 30% to 50%. The materials mentioned above allow for the realization of programmable resistance cells with a sufficiently large scale of integration and cells which may operated at advantageous operating temperatures in the range of usual ambient temperatures.

The interlayers 14, 18, 24 and the active electrodes 150, 151, 152, 25 preferably comprise silver, zinc, copper, or sodium—which provide an advantageous mobility in the abovementioned solid electrolyte materials and hence may reliably form a conductive path in said materials. Furthermore, the interlayers 14, 18, 24 comprise nitrogen in addition to the active electrode material. This allows for the active electrodes 152, 25 to be formed in an advantageous thin and homogeneous form on the interlayers 14, 18, 24. The nitrogen concentration in the interlayers 14, 18, 24 is preferably at least 15%. The thickness of the interlayers 14, 18, 24 may be preferably in the range of 1.5 nm to 5 nm.

The active electrodes 150, 151, 152, 25 and the interlayers 14, 18, 24 comprise active electrode material, such as silver, which, when ionized, may advantageously be driven easily through solid electrolyte materials and may thereby form low-resistive conductive paths between two facing electrodes. In this way, the solid electrolytes 13, 23, 130 are reversibly transferred from a high-resistive state to a low-resistive state.

Figure 3:
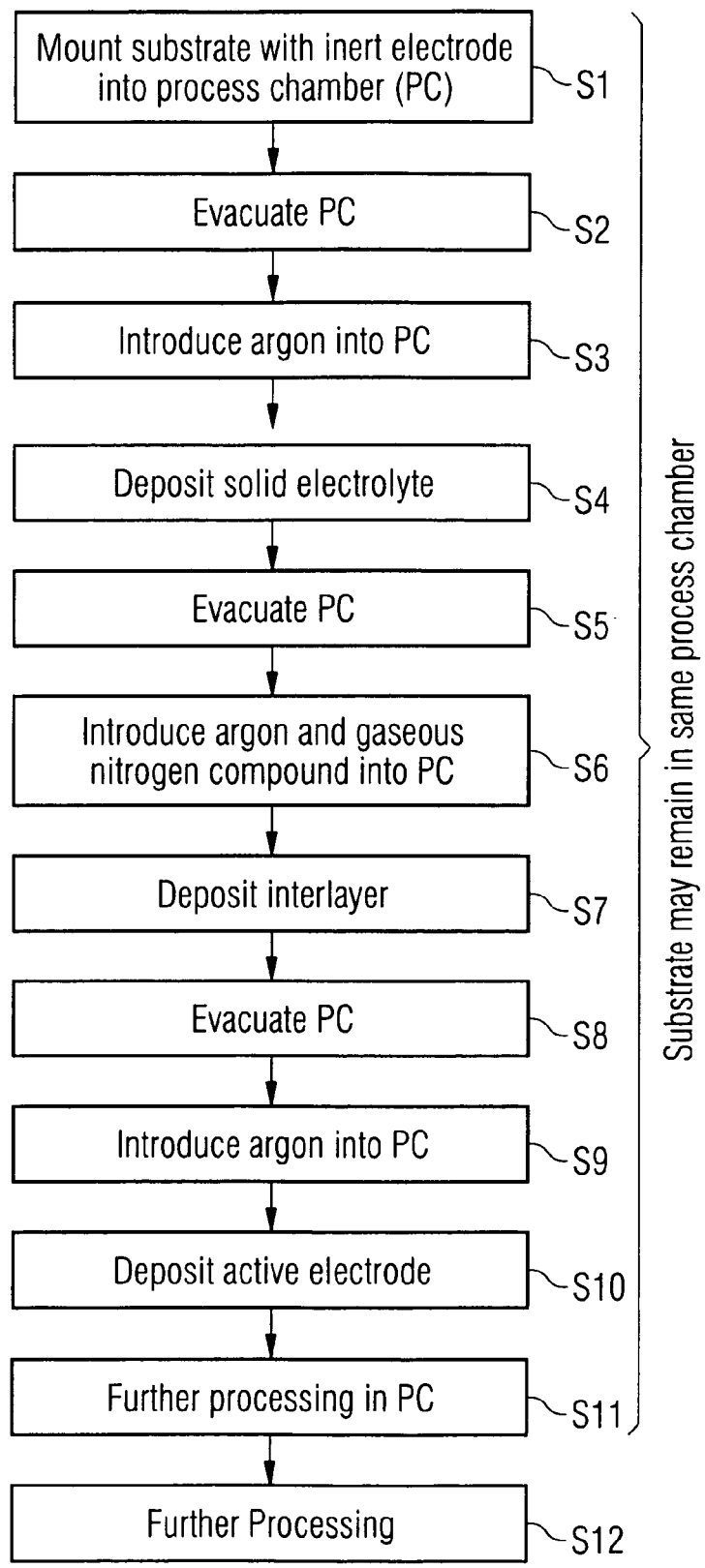
FIG. 3 shows a flow chart of the method according to a fourth embodiment of the present invention.

FIG. 3 shows a flowchart of the method employed to fabricate an integrated electronic circuit with programmable resistance cells according to a fourth embodiment of the present invention. In a preparation step S1, a substrate with an inert electrode is mounted into a process chamber (PC). The substrate may be formed from silicon and may already include electronic elements, such as transistors, conductive layers or insulation layers. Said inert electrode may be preferably in electric contact to said electronic elements and/or conductive layers.

Subsequently, the process chamber is evacuated in a first evacuation step S2 in order to provide a well-defined process atmosphere.

Following the evacuation of the process chamber, argon is introduced into the process chamber during a first introduction step S3, preferably at a flow rate of approximately 150 sccm (sccm=standard cm$^3$ per min). However, as an alternative to argon, it is also possible to use other standard inert process gases, such as nitrogen ($N_2$), helium (He), neon (Ne), or krypton (Kr).

This is followed by a first deposition step S4, in which a solid electrolyte, for example comprising germanium selenide (40:60), is deposited with a layer thickness ranging from 10 nm to 50 nm. The solid electrolyte may be deposited by means of RF sputtering in the process chamber, using radio-frequency (RF) radiation at a frequency of approximately 13.56 MHz and at a power of 200 W to 300 W.

During a sputtering process, one or more solid materials are atomized in a vacuum or in a well-defined process atmosphere. The process conditions are set accordingly to allow for a formation of a pure deposit of a stable layer from the atomized materials on a substrate. The well-defined process atmosphere may comprise argon during sputtering, which, as an inert noble gas, does not influence the materials, such as solid electrolyte or active electrode materials, during deposition.

After the deposition of the solid electrolyte, the process chamber is again evacuated in a second evacuation step S5, in order to provide a well-defined process atmosphere for the following deposition step.

Following the evacuation of the process chamber, in a second introduction step S6, argon gas and a gaseous nitrogen compound are introduced into the process chamber. As an alternative to argon, other standard inert process gases are again applicable. The flow rate of the employed inert gas, e.g. argon, preferably is in the range of 10 sccm to 50 sccm. The gaseous nitrogen compound may include, for example, nitrogen ($N_2$), ammonia ($NH_3$), or nitrogen dioxide ($NO_2$), and the flow rate of the nitrogen compound, for example nitrogen ($N_2$), is preferably in the range of 5 sccm to 20 sccm. During deposition, the gaseous nitrogen is split, or nitrogen is released from a gaseous nitrogen compound, such as $NH_3$ or $NO_2$, so that the atomic nitrogen may be incorporated into the active electrode material during deposition. In this way, nitrogen is steadily incorporated into the layer on the substrate.

In general, suitable gaseous nitrogen compounds, as far as the present invention is concerned, are compounds from which atomic nitrogen may be released by a plasma, while the residues of these compounds are not incorporated into the deposited material. For example, if ammonia ($NH_3$) and silver are employed, nitrogen N is released in an atomic form by the plasma and is deposited in combination with the atomized silver to form a silver/nitrogen layer, whereas the hydrogen H of the ammonia is not incorporated into the layer, but rather is discharged from the process chamber together with the inert process gas.

The interlayer is deposited with a layer thickness in the range of 1.5 nm to 5 nm in a second deposition step S7 by means of DC sputtering using a power in the range of 1.5 kW to 3 kW, preferably applied to a substrate with an approximate diameter ranging from 20 cm to 30 cm. The presence of the gaseous nitrogen compound during the sputtering leads to a reactive sputtering and to the nitrogen being incorporated into the deposited silver layer on the substrate. The nitrogen content preferably is at least 15%.

Following the deposition of the interlayer, the process chamber is again evacuated in a third evacuation step S8 in order to provide a well-defined process atmosphere for the subsequent processes.

Prior to the deposition of the active electrode layer, argon gas is again introduced into the process chamber in a third introduction step S9, preferably at a flow rate ranging from 10 sccm to 50 sccm.

Subsequently, the active electrode layer, comprising, for example, silver, is deposited with a layer thickness in the range of 10 nm to 50 nm by argon gas sputtering in a third deposition step S10. The DC power is preferably in the range of 1.5 kW to 3 kW, preferably applied to a substrate with an approximate diameter ranging from 20 cm to 30 cm. The argon flow rate is preferably in the range of 10 sccm to 50 sccm.

Furthermore, the process chamber can be configured in such a way that it is also possible for further process steps S11 to be carried out, while the substrate may remain in the same process chamber and in this way subjecting the substrate to a minimum of contamination. These further process steps include, for example, the deposition of a capping layer, which may comprise, e.g., tantalum nitride (TaN) or other related materials as appropriate.

This is followed by further processing S12 to complete the integrated electronic circuit. The further process steps S11 or the further processing S12 may be a part of a fabrication process, that is already known per se, for example steps and processing of a CMOS process.

The substrate may, as described, remain in the same process chamber during various process steps and it is possible for two or more layers to be formed within a single process chamber. This significantly reduces contamination and a disadvantageous alteration of the substrate surface and/or layers already present on the substrate.

Furthermore a further interlayer may be deposited on the solid electrolyte prior to the deposition of the interlayer by means of sputtering and introducing a gaseous nitrogen compound as described above.

The preceding description only describes advantageous exemplary embodiments of the invention. The features disclosed therein and the claims and the drawings can, therefore, be essential for the realization of the invention in its various embodiments, both individually and in any combination. While the foregoing is directed to embodiments of the present invention, other and further embodiments of this invention may be devised without departing from the basic scope of the invention, the scope of the present invention being determined by the claims that follow.

What is claimed is:

1. A method of fabricating an integrated electronic circuit having programmable resistance cells, comprising:
    providing a substrate;
    forming an inert electrode;
    forming a solid electrolyte on the inert electrode;
    forming an interlayer on the solid electrolyte, the interlayer comprising an active electrode material and nitrogen; and
    after forming the interlayer, forming an active electrode on the interlayer, the active electrode comprising the active electrode material.

2. The method as claimed in claim 1, wherein the solid electrolyte has a germanium content in a range of 30% to 50%.

3. The method as claimed in claim 1, wherein the solid electrolyte comprises germanium selenide.

4. The method as claimed in claim 1, wherein a thickness of the interlayer is between 1.5 nm and 5 nm.

5. The method as claimed in claim 1, wherein a nitrogen concentration in the interlayer is at least 15%.

6. The method as claimed in claim 1, wherein forming the interlayer is carried out by means of a sputtering process.

7. The method as claimed in claim 6, wherein the sputtering process is carried out in a well-defined process atmosphere.

8. The method as claimed in claim 7, wherein the well-defined process atmosphere comprises argon.

9. The method as claimed in claim 7, wherein the well-defined process atmosphere comprises at least one of:
    nitrogen ($N_2$),
    ammonia ($NH_3$), and
    nitrogen dioxide ($NO_2$).

10. The method as claimed in claim 1, wherein the active electrode is formed homogeneously on the interlayer.

11. The method as claimed in claim 1, wherein forming the interlayer and forming the active electrode are carried out by means of a sputtering process, wherein a process atmosphere comprises a gaseous nitrogen compound while sputtering the interlayer.

12. The method as claimed in claim 1, wherein the active electrode material comprises silver.

13. A programmable resistance cell formed on a substrate, comprising:
    an inert electrode;
    a solid electrolyte on the inert electrode;
    an interlayer on the solid electrolyte, the interlayer comprising an active electrode material and nitrogen; and
    an active electrode on the interlayer such that the interlayer is between the solid electrolyte and the active electrode, the active electrode comprising the active electrode material.

14. The cell as claimed in claim 13, wherein the solid electrolyte has a germanium content in a range of 30% to 50%.

15. The cell as claimed in claim 13, wherein the solid electrolyte comprises germanium-selenide.

16. The cell as claimed in claim 13, wherein a nitrogen concentration in the interlayer is at least 15%.

17. The cell as claimed in claim 13, wherein a thickness of the interlayer is between 1.5 nm and 5 nm.

18. The cell as claimed in claim 13, wherein the active electrode is formed homogeneously on the interlayer.

19. The cell as claimed in claim 13, wherein the active electrode material comprises silver.

20. A programmable resistance cell formed on a substrate, comprising:
- an inert electrode;
- a solid electrolyte deposited above the inert electrode;
- an interlayer deposited above the solid electrolyte, the interlayer comprising an active electrode material and one other material; and
- an active electrode deposited above the interlayer such that the interlayer is between the solid electrolyte and the active electrode, the active electrode comprising the active electrode material.

* * * * *